(12) United States Patent
Miller

(10) Patent No.: US 6,882,546 B2
(45) Date of Patent: Apr. 19, 2005

(54) MULTIPLE DIE INTERCONNECT SYSTEM

(75) Inventor: Charles A. Miller, Fremont, CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 09/970,749

(22) Filed: Oct. 3, 2001

(65) Prior Publication Data

US 2003/0063450 A1 Apr. 3, 2003

(51) Int. Cl.[7] .............................. H05K 7/02; H05K 7/06; H05K 7/08; H05K 7/10
(52) U.S. Cl. ........................................ 361/783; 361/803
(58) Field of Search ................................. 361/760–764, 361/759, 783–787, 803, 769–776; 439/876; 257/773–774

(56) References Cited

U.S. PATENT DOCUMENTS 5,969,952 A * 10/1999 Hayashi et al. ............. 257/696
6,330,164 B1 * 12/2001 Khandros et al. ........... 257/724

FOREIGN PATENT DOCUMENTS

| EP | 0638931 | 2/1995 |
| EP | 1067602 | 10/2001 |
| GB | 2297652 | 8/1996 |

* cited by examiner

Primary Examiner—David A. Zarneki
Assistant Examiner—Tuan Dinh
(74) Attorney, Agent, or Firm—Smith-Hill & Bedell PC; Fliesler Meyer LLP

(57) ABSTRACT

A multiple integrated circuit (IC) die assembly includes a base IC die and secondary IC dice mounted on a surface of the base IC die. A set of protruding contacts formed on the surface of the base IC die and extending beyond the secondary IC dice link the surface of the base IC die to a printed circuit board (PCB) substrate with the secondary IC die residing between the base IC die and the PCB substrate.

12 Claims, 7 Drawing Sheets

MULTIPLE DIE INTERCONNECT SYSTEM

BACKGROUND OF THE INVENTION

1. Field of the Invention

The present invention relates to a system for interconnecting a multiple die assembly to a printed circuit board or other substrate.

2. Description of Related Art

Figure 1:
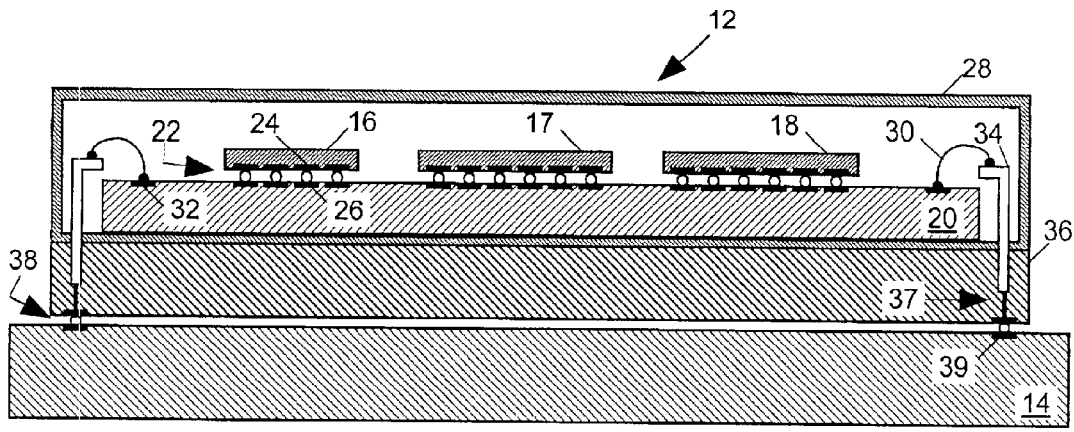

FIG. 1 is a simplified sectional elevation view of a prior art multiple die electrical system 10 including a multiple die assembly 12 mounted on a printed circuit board (PCB) or other substrate 14. Multiple die assembly 12 includes a set of secondary dice 16–18 mounted directly on a base die 20 within an integrated circuit (IC) package 28. Solder 22 conductively links bond pads 24 on dice 16–18 to bond pads 26 on die 20. An IC socket 36 mounted on substrate 14 releasably secures and interconnects each package pin 34 through a contact 37 and a solder ball 38 to one of a set of traces 39 on PCB 14. Bond wires 30 link various bond pads 32 on base die 20 to package pins 34. For illustration purposes solder 22 is shown much thicker than it would be after being melted and re-solidified to bond pads 24 to pads 26. While only two package pins 34 are shown in FIG. 1, a typical IC package will have many package pins.

Multiple die assemblies including one or more secondary dice directly mounted on a base die are often used where high frequency communication between die is needed because the relatively short signal paths between the secondary and base dice can convey high frequency signals. For example multiple die assemblies have been used to link dice implementing random access memories (RAMs) to a die implementing a microprocessor so the microprocessor can read and write access the RAMS at their highest rates without being limited by the bandwidth of the interconnection.

Figure 2:
Figure 2:
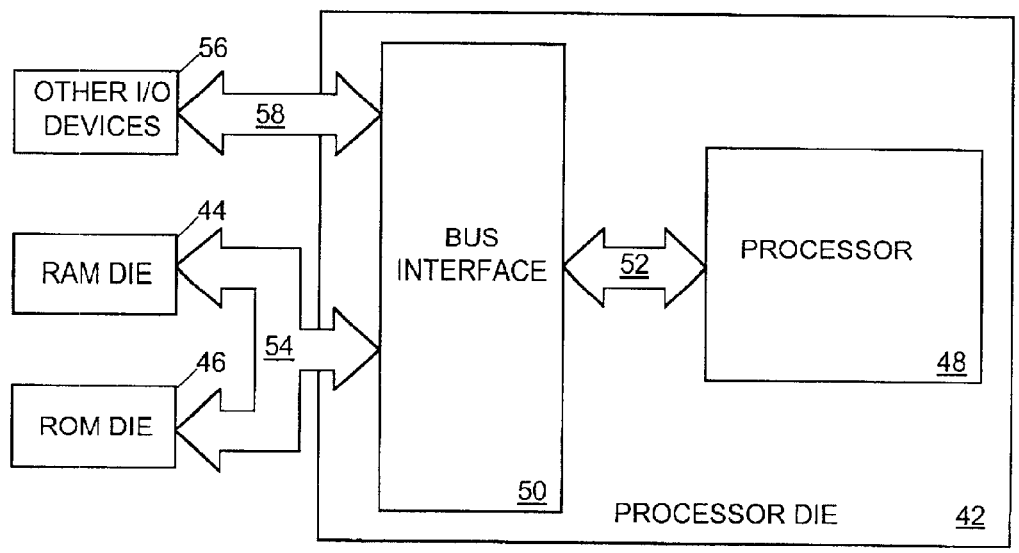

FIG. 2 is a simplified block diagram of a prior art computer system 40 including a processor die 42, a random access memory (RAM) die 44 and a read only memory (ROM) die 46. Processor die 42 contains a processor 48, a bus interface circuit 50 and an internal bus 52 connecting processor 48 to bus interface circuit 50. Bus interface circuit 50 links processor 48 to RAM die 44 and ROM die 46 through a parallel memory bus 54 and to other IC devices 56 through a parallel input/output (I/O) bus 58. The speed with which processor 48 communicates with RAM die 44, ROM die 46 and other devices 56 is a function of the frequency of signals conveyed by buses 54 and 58; the higher the signal frequency, the faster the communication. However shunt capacitances and series inductances of buses 54 and 58 attenuate and distort signals; the higher the signal frequency the greater the signal attenuation and distortion. Hence we must limit frequencies of signals on buses 54 and 58 to levels for which signal attenuation and distortion remain within acceptable limits.

Since the shunt capacitance and series inductance of a bus are increasing functions of bus length, we can increase bus operating frequency limits by reducing the length of the bus. To reduce signal path distances of bus 54 the dice 44 and 46 implementing RAM and ROM could be mounted directly on processor die 42. Thus, for example, one or more of secondary die 16–18 of FIG. 1 could implement RAM and ROM and base die 20 could implement a processor die.

It is possible to test multiple die assembly 12 of FIG. 1 before packaging it using test equipment accessing pads 32 through test probes. However since the probes may not have the same impedance characteristics as bond wires 30 and package pins 34, the test interconnect environment may not accurately model the operating interconnect environment of assembly 12 when later installed in package 28 and interconnected with PCB 14 through bond wires 30 and package pins 34. Thus the test may overestimate or underestimate the effects of signal attenuation and distortion caused by bond wires 30 and package pins 34.

Figure 3:
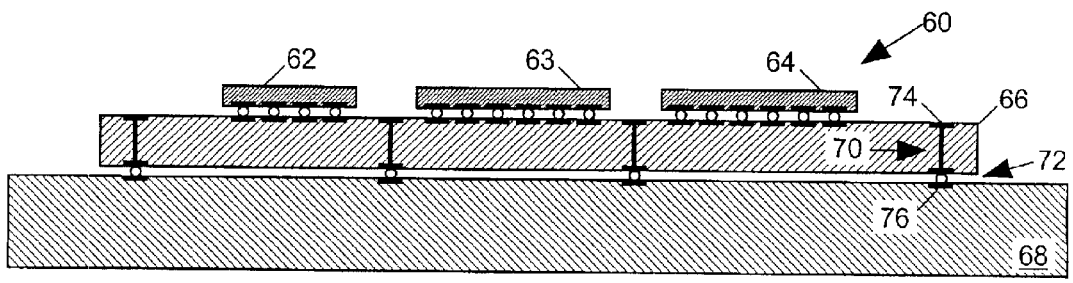

While the multiple die assembly architecture of FIG. 1 can link RAM and ROM dice 44 and 46 to processor die 42 through short signal paths, processor die 42 must still communicate with other I/O devices 56 that may be mounted on PCB substrate 14 of FIG. 3 through relatively long signal paths formed by bond wires 30, package pins 34 and socket 36. One way to reduce signal path lengths between the base die 20 and the PCB substrate 14 has been to mount the base die directly on the substrate and link the circuits on the upper surface of the base die to the substrate through vias passing vertically through the base die.

FIG. 3 is a simplified sectional elevation view of a prior art multiple die assembly 60 including secondary die 62–64 mounted on and linked to a base die 66 generally similar to multiple die assembly 12 of FIG. 1. However while the system of FIG. 1 packages the multiple die assembly 12 and uses bond wires 30, package pins 34 and connector 37 to link pads 32 on base die 20 to traces 39 on PCB substrate 14, the system of FIG. 3 mounts base die 66 directly on a PCB substrate 68 and uses conductive vias 70 passing though base die 66 and solder 72 to link pads 74 on an upper surface of the base die to traces 76 on substrate 68. Vias 70 provide shorter signal pathways than the bond wires 30 and package pins 34 of system 10 (FIG. 1). However vias 70 are difficult and expensive to fabricate.

Thus what is needed is a system that can reduce signal path lengths between a base die of a multi-die assembly and a PCB or other substrate without having to form vias through the base die. The system should also permit IC testers to access the base and secondary dice through signal paths having similar impedance characteristics to the paths later used to interconnect them to one another and to a PCB or other substrate.

BRIEF SUMMARY OF THE INVENTION

A multiple die assembly includes a base integrated circuit (IC) die and at least one secondary IC die having input/output (I/O) pads electrically connected to I/O pads on a surface of the base IC die so that the base die can communicate with the secondary die.

In accordance with an embodiment of the invention protruding contacts formed on the surface of the base IC die and extending outward beyond the secondary die directly interconnect I/O pads of the base IC die to conductors on a surface of a substrate with the base IC die and the substrate face each other with the secondary ICs there between. Since the protruding contacts are relatively short, they provide relatively low impedance signals paths between the base die and the substrate.

The claims portion of this specification particularly points out and distinctly claims the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 4:
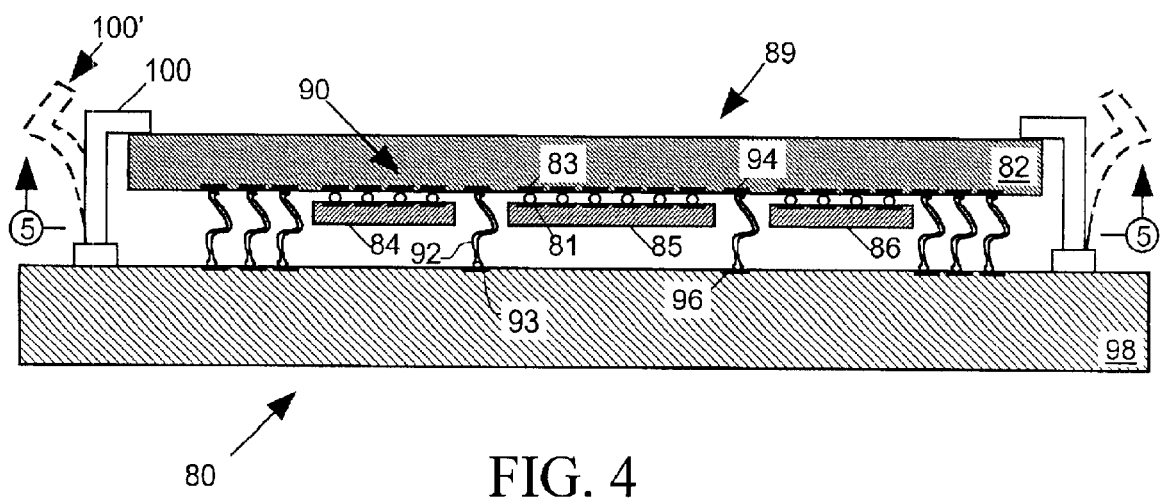
Figure 5:
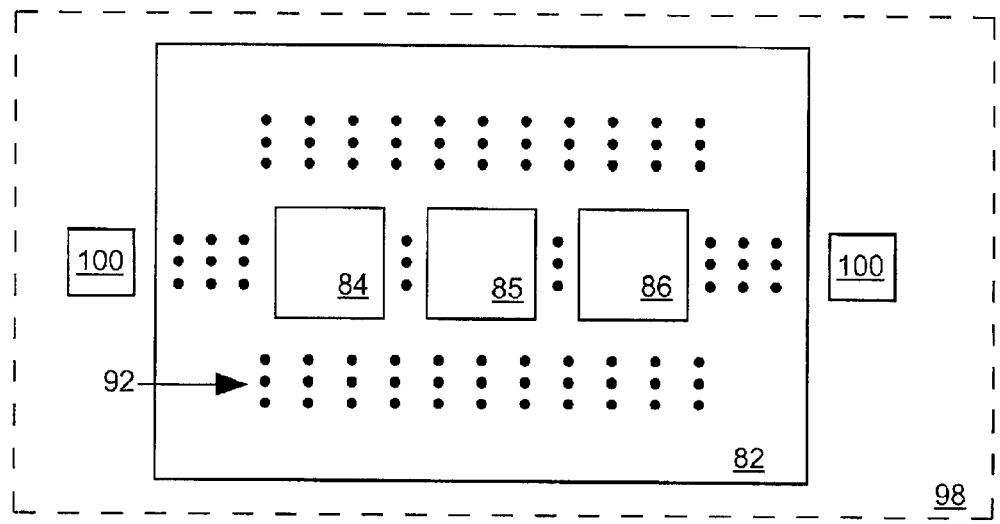
Figure 6:
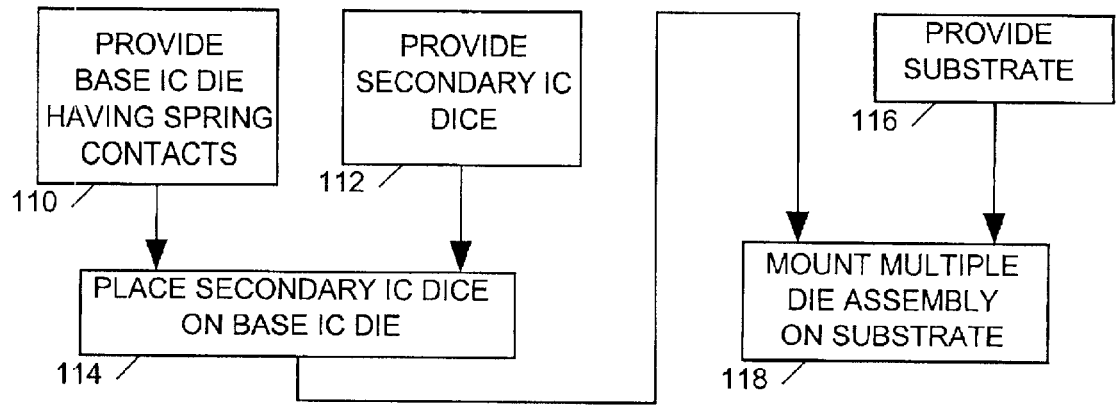
Figure 7A:
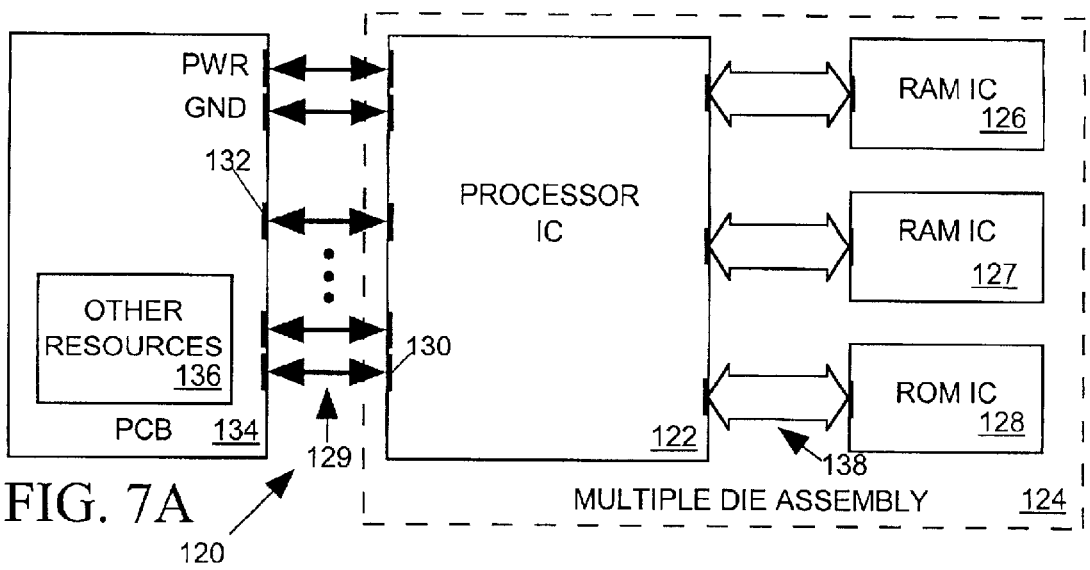
Figure 7B:
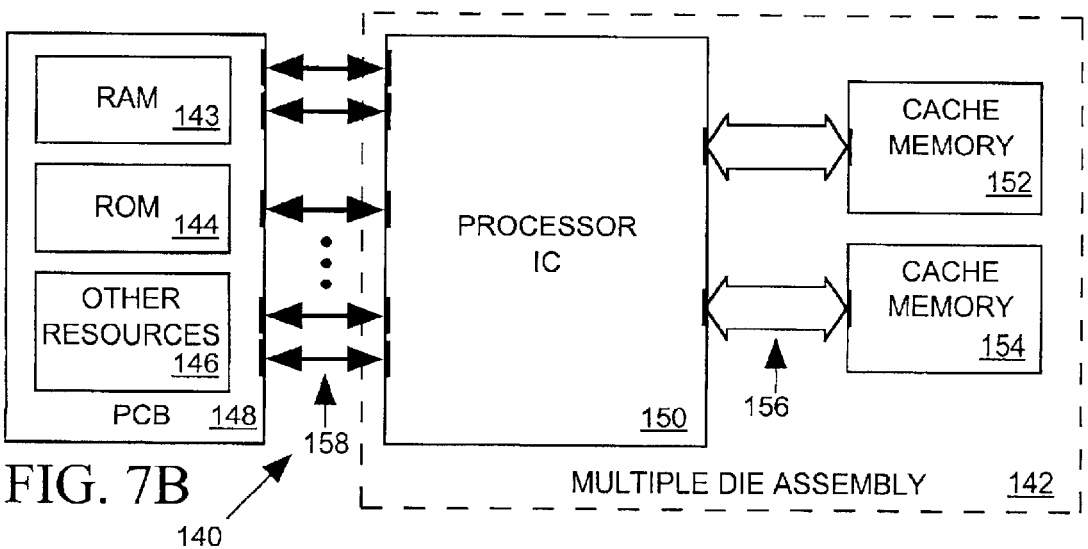
Figure 7C:
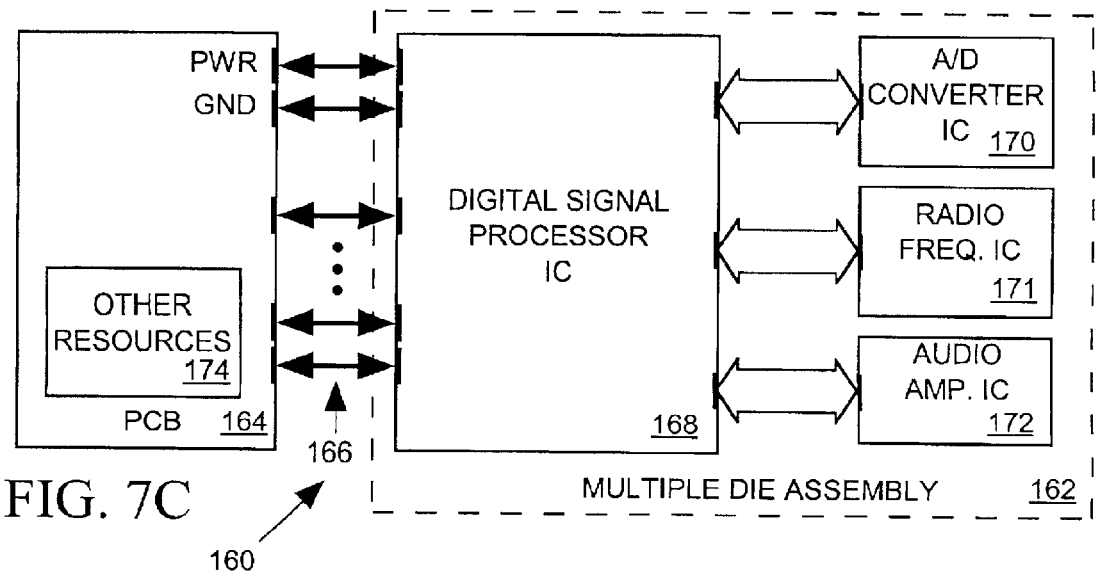
Figure 8A:
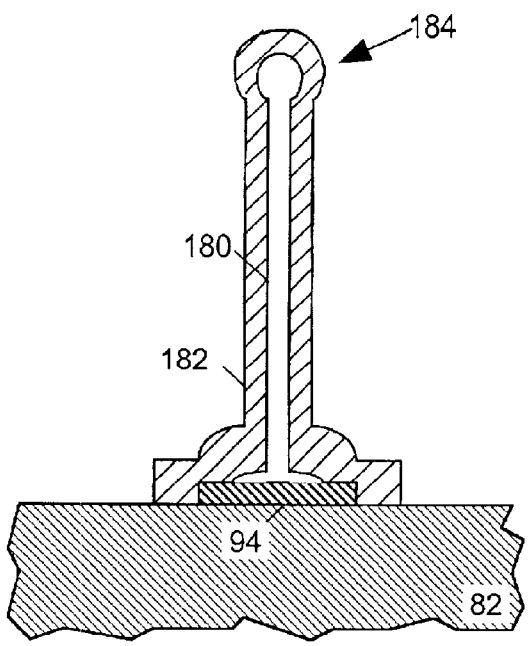
Figure 8B:
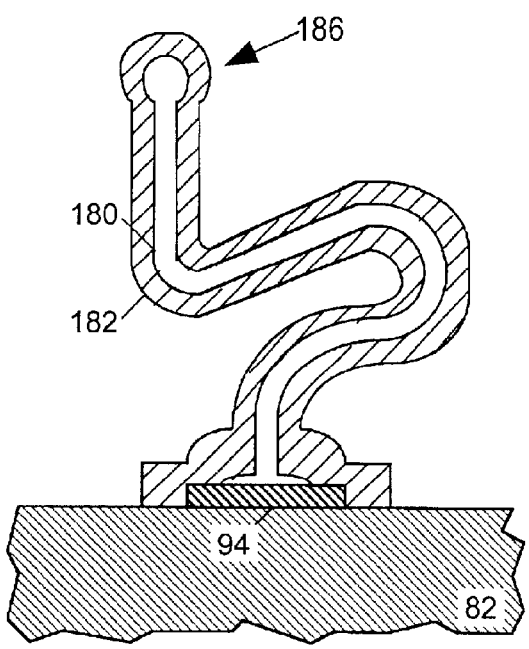
Figure 9A:
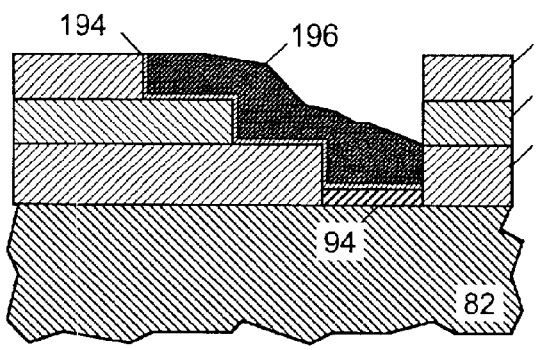
Figure 9B:
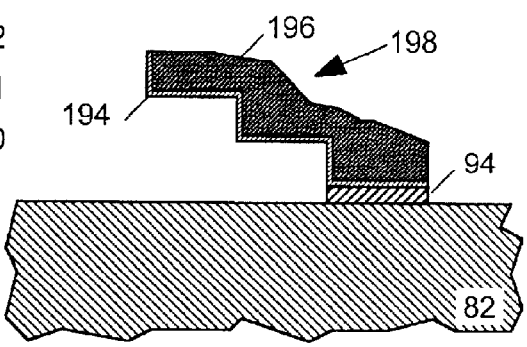
Figure 10:
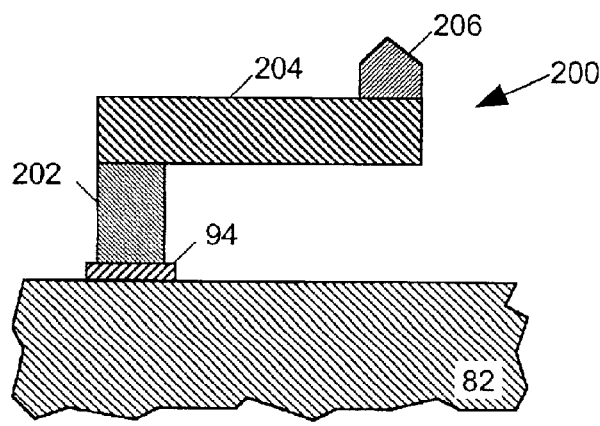
Figure 11:
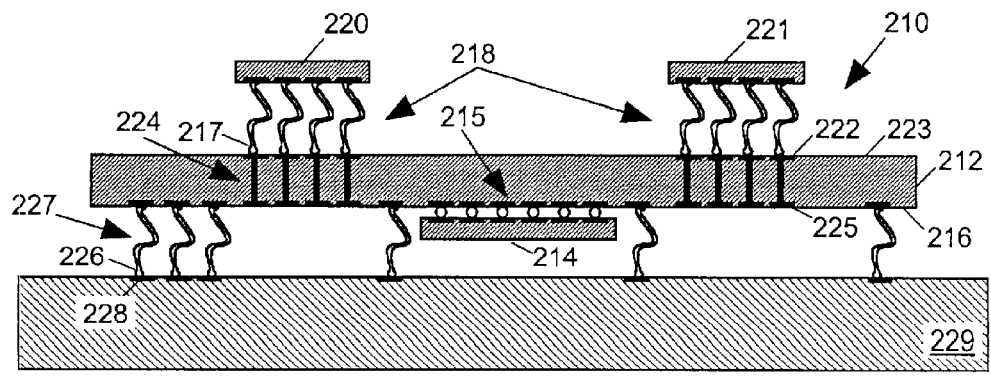
Figure 12:
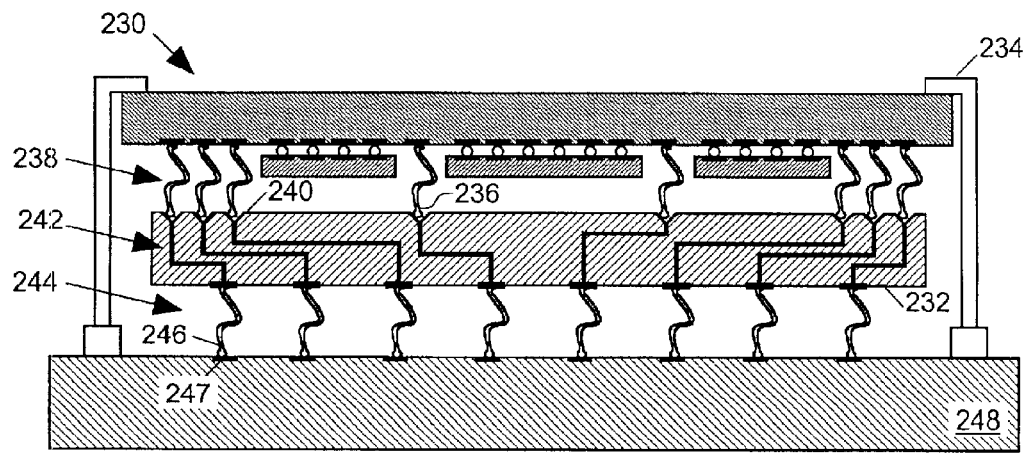
Figure 13:
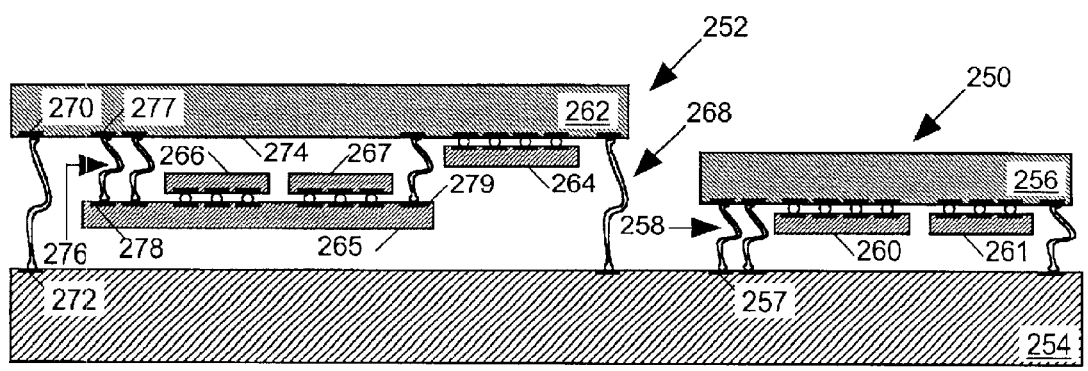
Figure 14A:
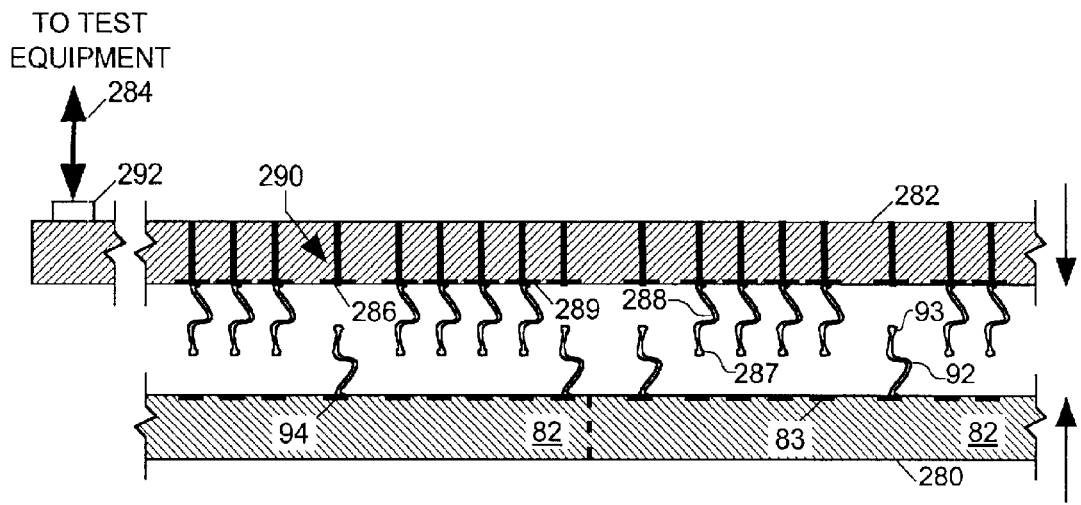
Figure 14B:
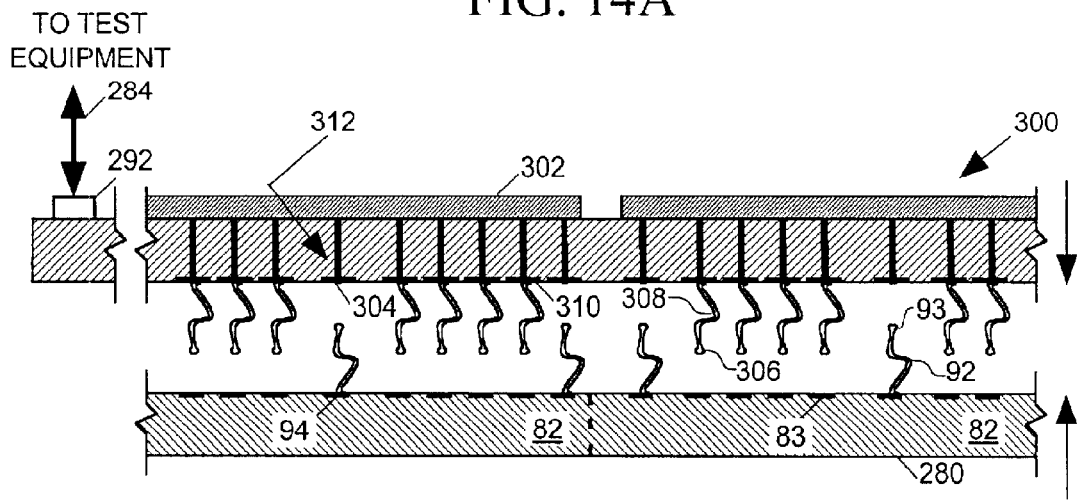
Figure 15:
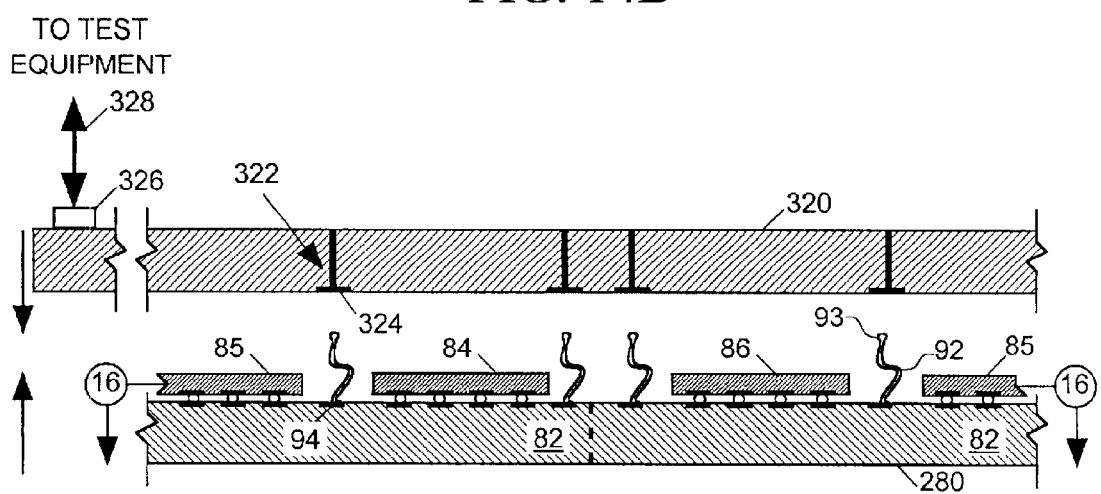
Figure 16:
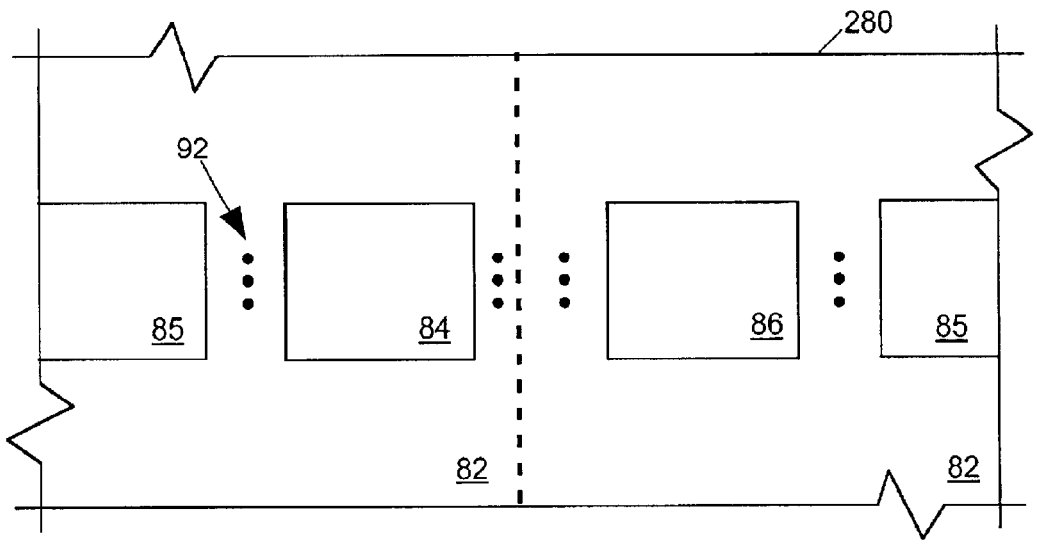
Figure 17:
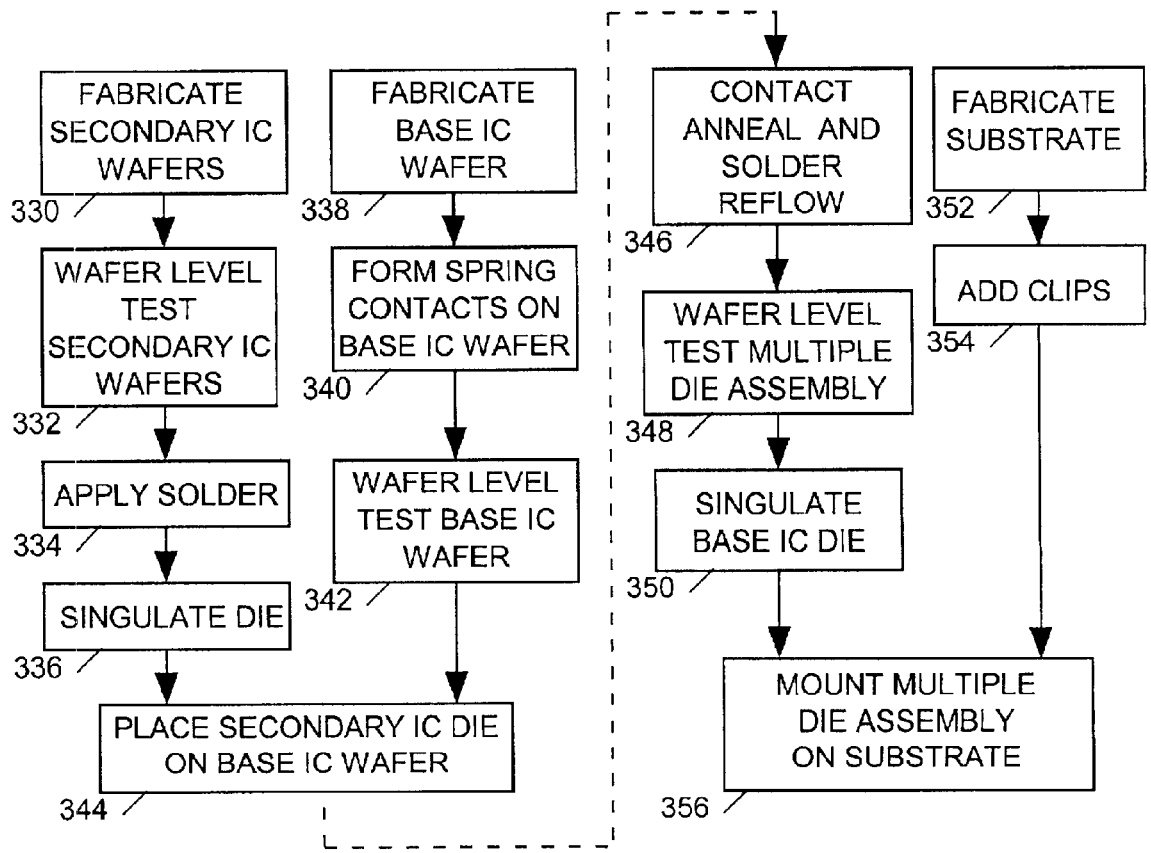

FIG. 1 is a sectional elevation view of a prior art packaged multiple die assembly mounted on a circuit board, FIG. 2 illustrates a prior art computer system in simplified block diagram form, FIG. 3 is a sectional elevation view of an un-packaged prior art multiple die assembly mounted on a circuit board, FIG. 4 is a sectional elevation view of a multiple die assembly connected to a substrate in accordance with an embodiment of the invention, FIG. 5 is a sectional plan view of the system of FIG. 4, FIG. 6 is a flow chart illustrating the basic steps in a method for forming and mounting a multiple die assembly on a substrate in accordance with an embodiment of the invention, FIGS. 7A–7C illustrate in block diagram form several examples implementing multiple die assemblies in accordance with an embodiment of the invention, FIGS. 8A and 8B are sectional elevation views of types of contacts suitable for interconnecting the multiple die assembly of FIG. 4, FIGS. 9A and 9B are sectional elevation views of the formation of a type of lithographic spring contact suitable for interconnecting the multiple die assembly of FIG. 4, FIG. 10 is a sectional elevation view of another type of lithographic spring contact suitable for interconnecting the multiple die assembly of FIG. 4, FIG. 11 is a sectional elevation view of a multiple die electrical system having secondary dice mounted on both sides of a base die in accordance with another embodiment of the invention, FIG. 12 is a sectional elevation view of a multiple die assembly releasably mounted in a spring contact socket in accordance with a further embodiment of the invention, FIG. 13 is a sectional elevation view of a multiple-level multiple die assembly in accordance with yet a further embodiment of the invention, FIGS. 14A and 14B are sectional elevation views of a wafer containing several processor ICs of FIG. 4 being tested by two different probe substrates, FIG. 15 is a sectional elevation view of a multiple die assembly of FIG. 4 being tested by a probe substrate, FIG. 16 is a sectional plan view of the semiconductor wafer of FIG. 15, and FIG. 17 is a flow diagram illustrating a method for fabricating and testing the system of FIG. 4.

DETAILED DESCRIPTION OF THE INVENTION

The present invention is directed to multiple die assemblies, and this specification describes several exemplary embodiments and applications of the invention. However the invention is not limited to these exemplary embodiments and applications or to the particular manner in which the exemplary embodiments and applications operate or are described herein.

FIG. 4 is a sectional elevation view of an interconnect system 80 in accordance with an exemplary embodiment of the invention for providing signal paths between a multiple die assembly 89 and a substrate 98. FIG. 5 is a sectional plan view along cut line 5—5 of FIG. 4. In the preferred embodiment of the invention, substrate 98 is a printed circuit board (PCB) for holding integrated circuit or other devices (not shown) that are to communicate with circuits implemented within multiple die assembly 89. However substrate 98 may be any other kind of substrate for holding devices such as, for example, a semiconductor substrate on which are formed integrated circuits that communicate with multiple die assembly 89. Assembly 89 includes a base integrated circuit (IC) die 82 and three smaller secondary IC dice 84–86 mounted on the base die. Solder 90 (shown in FIG. 4 with exaggerated thickness) conductively links bond pads 81 on dice 84–86 to bond pads 83 on base IC die 82. While FIGS. 4 and 5 illustrate multiple die assembly 89 as including three secondary die 84–86 mounted on a base die 82, alternative embodiments of the invention may include less than or more than three secondary die mounted on a base die.

As illustrated in FIG. 4, a set of resilient spring contacts 92 are formed directly on another set of bond pads 94 of base IC die 82. A free end 93 of each spring contact 92 extends beyond the secondary IC dice 84–86 to mate with a set of conductive traces 96, contact pads or other conductors on substrate 98. Spring contacts 92 convey data, power and ground signals between pads 96 on substrate 98 and pads 94 on base die 82. (In alternative embodiments of the invention spring contacts 92 may be formed on substrate 98 and extend upward to mate with contact pads on die 82.) A set of clips 100 clamp assembly 89 against substrate 98, and spring contacts 92 flex to accommodate any unevenness in spacing between pads 94 and traces 96.

Although not necessary to the invention, alignment mechanisms may be used to ensure that assembly 89 properly aligns with substrate 98 align. For example alignment pins (not shown) embedded in PCB substrate 98 may either mate with holes formed in base IC die 82 or may guide the perimeter of base IC 82. Alternatively a suitable frame assembly (not shown) may be provided to align assembly 89 with substrate 98.

FIG. 6 is a flow chart illustrating a method for forming and mounting multiple die assembly 89 of FIGS. 4 and 5 on substrate 98. The base IC die 82 having spring contacts 92 formed thereon is provided at step 110 and secondary IC dice 84–86 are provided at step 112. The secondary dice 84–86 are then mounted on the base die (step 114) to form a multiple die assembly. A substrate is provided at step 116 and the multiple die assembly is mounted on the substrate (step 118) to complete the assembly process.

Applications

An interconnect system employing spring contacts 92 to link the base die 82 of multiple die assembly 89 to a PCB or other type of substrate 98 has many applications. Circuits that are to communicate through very high frequency signals with a circuit implemented in a base die are suitably implemented as secondary die because the solder connections between the base and secondary die are short, have very little impedance and can convey very high frequency signals with little distortion. Circuits that are to communicate with the circuit implemented on the base die at somewhat lower frequencies can be implemented in ICs mounted on substrate 98.

For example, FIG. 7A illustrates in block diagram form a computer system 120 wherein the base die 122 of a multiple die assembly 124 implements a processor and wherein the secondary dice 126–128 of the assembly implement high speed random access and read only memories. Spring contacts 129 link pads 130 on the base die 122 to pads 132 on PCB 134 upon which other resources 136 the computer accesses are mounted. Thus the base processor IC die 122 is able to communicate at very high frequencies with RAM and ROM IC die 126–128 though solder connections 138 and at though somewhat lower (though still relatively high) frequencies with other resources 136 mounted on PCB 134 through the short spring contacts 129 and traces (not shown) on PCB 134 linking resources 136 to processor IC 150.

FIG. 7B illustrates another example computer system 140 in which a multiple die assembly 142, low speed RAM and ROM ICs 143 and 144 and other I/O devices 146 are mounted on a PCB 148. Multiple die assembly 142 includes a base die 150 implementing a processor IC and secondary dice 152 and 154 implementing high speed cache memories. In this example, base processor IC die 150 communicates at high frequencies with the high speed cache memory die 152 and 154 though solder connections 156 and at somewhat lower frequencies with RAM 143, ROM 144 and other resources 146 through short spring contacts 158 and traces (not shown) on PCB 148.

FIG. 7C illustrates in block diagram form an example digital signal processing system 160 including a multiple die assembly 162 linked to a PCB 164 through spring contacts 166. The base die 168 of assembly 162 implements a digital signal processor (DSP) 172 while secondary ICs 170–172 implement resources that base DSP die 168 needs to access at high frequency such as, for example, an A/D converter IC, a radio frequency IC, and an audio amplifier IC. Other resources 174 that DSP IC 168 may access at lower frequencies via spring contacts 166 and traces on PCB 164 are mounted on the PCB.

While FIGS. 7A–7C illustrate advantageous applications of the invention, the invention is not limited to those applications.

Interconnect Structures

While for simplicity FIG. 4 shows only a small number of thick spring contacts 92, in practice many small spring contacts may be employed to convey data, control, power and/or ground signals between base IC die 82 and substrate 98. Spring contacts 92 may be of any of a variety of suitable shapes, and although spring contacts 92 are preferred for connecting base die 82 to a PCB or other substrate 98, any other type of protruding conductor providing sufficient space for secondary die 84–86 to reside between base die 82 and substrate 98 can be used.

U.S. Pat. No. 5,917,707 issued Jun. 29, 1999 (incorporated herein by reference) describes a method for forming a post contact appropriate for use as spring contacts 92 of FIG. 4. As illustrated in FIG. 8A a bond wire 180 is attached to one of pads 94 on base die 82 and coated with a layer 182 of resilient conductive material such as nickel to form a straight post-type contact 184. Alternatively, as illustrated in FIG. 8B the bond wire 180 can be bent into a cantilevered shape prior to nickel coating so that the resulting spring contact 186 has additional resiliency. The bond wire 180 at the core of the spring contact is preferably formed of a soft, readily shapeable material and the coating layer 182 is preferably formed from a harder material that imparts strength and resiliency to the spring contact structure.

U.S. Pat. No. 6,184,053 issued Feb. 6, 2001 (incorporated herein by reference) teaches a method for using lithographic techniques to form spring contacts suitable for use as spring contacts 92 of FIG. 4. As illustrated in FIG. 9A, base die 82 is successively coated with several masking layers 190–192 that are lithographically patterned and etched to expose pads 94. A conductive seed material such as titanium/tungsten is then formed on layer 192 and patterned form a thin seed layer 194 defining the shape of a spring contact. Conductive material 196 such as nickel is then electroplated onto seed layer 194, and remaining portions of masking layers 190–192 are then removed to expose a cantilevered spring contact 198 as illustrated in FIG. 9B.

U.S. patent application Ser. No. 09/205,022 filed Dec. 2, 1998 (incorporated herein by reference) describes another method for fabricating a spring contact 200, as illustrated in FIG. 10, suitable for use as a spring contact 92 of FIG. 4. Spring contact 200 includes a conductive post 202 rising from IC pad 94, a beam 204 extending horizontally outward from post 202 and a conductive contact 206 formed on a distal end of beam 204. Post 202, beam 204 and contact 206 are formed by lithographically patterning and etching successive layers of conductive material formed on the surface of the base die 82.

While FIG. 4 illustrates a die assembly 89 having three secondary dice 84–86 mounted underneath base die 82, alternative embodiments within the scope of the invention may include one, two or more than three secondary die. Also additional secondary die may be mounted on the upper surface of the base die rather than on the lower surface. While solder 90 is used to link bond pads 81 of secondary dice 84–86 to pads 83 of base die 82, other means such as spring contacts, bumps, pads for providing signal paths between the base and secondary die may be employed. Also, while the interconnect system 80 of FIG. 4 employs clips 100 to hold assembly 89 in place on substrate 98, other means for holding assembly 89 in place on substrate 98 may be employed.

For example, FIG. 11 illustrates a multiple die assembly 210 including a base die 212 and a secondary die 214 linked by solder 215 to pads of an integrated circuit implemented on the lower surface 216 of base die 212. Free ends 217 of a set of spring contacts 218 formed on surfaces of two other secondary die 220 and 221 are soldered to pads 222 on an upper surface 223 of base die 212. A set of conductive vias 224 passing vertically though or around edges of base die 212 link pads 222 to pads 225 formed on the lower surface 216 of base die 212. Free ends 226 of another set of spring contacts 227 formed on the lower surface 216 of base IC 212 are soldered to pads 228 on the upper surface of a PCB 229. Thus the integrated circuit formed on the lower surface 216 of base IC 212 communicates with secondary IC 214 through solder connections 215, with secondary ICs 220 and 221 through spring contacts 218 and vias 224, and with pads 228 on PCB 229 through spring contacts 227. U.S. patent application Ser. No. 09/819,181 filed Mar. 27, 2001 (incorporated herein by reference) describes various methods for forming vias in semiconductor wafers.

In FIG. 4, clips 100 apply pressure to spring contacts 92 to hold them in place on pads 93 on the surface of PCB substrate 98, while in FIG. 11, free ends 226 of spring contacts 227 are soldered to pads 228 of PCB 229. However alternative embodiments of the invention may employ a spring contact socket to link the spring contacts of the base IC die to the substrate. U.S. Pat. No. 6,033,935 issued Mar. 7, 2000 (incorporated herein by reference) describes spring contact sockets in detail. For example, FIG. 12 is a sectional elevation view of a multiple die assembly 230 releasably mounted in a spring contact socket 232. A set of clips 234 push down on assembly 230 to hold free ends 236 of a set of spring contacts 238 of assembly 230 against contacts 240 of spring contact socket 232. Signal paths 242 within socket 232 link spring contacts 238 to another set of spring contacts 244 extending below socket 232 and having free ends 246 soldered to traces 247 on a substrate 248.

While spring contacts 92 of FIG. 4 link the base die 82 of a multiple die assembly 89 to a PCB substrate 98, they may alternatively link the base die to another IC die to form a hierarchical die assembly having more than two die levels. For example FIG. 13 shows a "two-level" multiple die assembly 250 and a "three-level" multiple die assembly 252 mounted on a substrate PCB 254. The two-level multiple die assembly 250 includes a base die 256 linked to pads 257 of PCB substrate 254 through spring contacts 258. A pair of secondary die 260 and 261 are soldered to base die 256. The three-level multiple die assembly 252 includes a base die 262, a pair of "second level" die 264 and 265, and a pair of "third level" die 266 and 267. A set of spring contacts 268 formed on pads 270 of base die 262 link base die 262 to PCB substrate 254. Spring contacts 268 are soldered to pads 272 on the upper surface of PCB substrate 254. Second level die 264 is soldered to a lower surface 274 of base die 262, while second level die 265 is linked to base die 262 through a set of spring contacts 276 formed on signal pads 277 on the lower surface of base die 262. Spring contacts 276 are soldered to signals pads 278 on an upper surface 279 of secondary die 265. Third level die 266 and 267 are soldered to second level die 265.

Since the IC formed on a semiconductor die resides only in the uppermost portion of the die, the die can be thinned by removing semiconductor material from its lower side without harming the IC formed in the die. Thus the lengths of spring contacts 258, 268 and 276 of FIG. 13 can be minimized by thinning dice 260, 261, 264, 265, 266, and 267.

Fabrication and Testing

The base die 82 and secondary die 84–86 of FIG. 4 can be tested before they are separated from the semiconductor wafers on which they are formed. Since spring contacts 92 are formed on base die 82 before the die is separated from its wafer, those spring contacts can be used to link the base die to test equipment. Thus the test equipment is able to access base die 82 through a signal path having the same impedance characteristics as the paths that will later link base die 82 to substrate 98 in its intended operating environment.

FIG. 14A depicts an IC wafer 280 containing a set of base dice 82 approaching a probe substrate 282 that is linked to external test equipment (not shown) through a cable 284. The external test equipment supplies test signals to dice 82 and receives and processes response signals produced by the dice to determine whether dice 82 respond properly to the test signals. As wafer 280 nears substrate 282, pads 286 on the under surface of substrate 282 mate with free ends 93 of spring contacts 92 formed on base IC wafer 280. Free ends 287 of another set of spring contacts 288 formed on pads 289 on the lower surface of substrate 282 mate with bond pads 83 on the surface of dice 83. Vias 290 passing through substrate 282 and traces (not shown) on the surface of substrate 282 link pads 286 and 289 to a cable connector 292. The external test equipment links to the ICs 82 being tested through cable 284, connector 292, vias 290 and spring contacts 92 and 288. Some of spring contacts 92 deliver power and ground signals from substrate 282 to ICs 82.

FIG. 14B depicts IC wafer 280 containing base dice 82 approaching a probe substrate 300. A set of test ICs 302 mounted on substrate 300 and external test equipment (not shown) linked to substrate via a cable 284 are provided to test dice 82. As wafer 280 nears substrate 300, pads 304 on the under surface of substrate 300 mate with free ends 93 of spring contacts 92 formed on base IC wafer 280. Free ends 306 of spring contacts 308 formed on pads 310 on the lower surface of substrate 300 mate with bond pads 83 on the surface of dice 82. Vias 312 passing through substrate 300 link test ICs 302 to pads 304 and 310. Test and response signals pass between test ICs 302 and the dice 82 being tested through vias 312 and spring contacts 92 and 308. Some of spring contacts 92 also deliver power and ground signals from substrate 300 to dice 82. Testing functions are allocated between the test IC 302 mounted on substrate 300 and the external test equipment. For example the test ICs 302 may only include buffers for forwarding test signals generated by the external test equipment to dice 82 and for forwarding response signals produced by the dice back to the external test equipment. Alternatively, as another example, test ICs may include circuits that independently test the ICs by internally generating the test signals and processing the response signals, and that forward test results back to the external test equipment.

The test systems illustrated in FIGS. 14A, 14B and 15 are exemplary; other test system configurations may be employed. For example, Test ICs 302 may be mounted external to substrate 300 of FIG. 14B. Conversely, test ICs can be mounted on substrates 282 and 320 of FIGS. 14A and 15.

After they are tested, secondary die 84–86 are separated from their wafers and mounted on each properly functioning base die 82 of wafer 280, and the resulting multiple die assemblies 89 can be tested as illustrated in FIGS. 15 and 16. FIG. 15 shows wafer 280 approaching a probe substrate 320. FIG. 16 is a sectional plan view along the line 16—16 of FIG. 15. Probe substrate 320 includes vias 322 for linking pads 324 on its under surface to traces (not shown) on its upper surface linked to a connector 326 and cable 328 linked to external test equipment. As wafer 280 nears test substrate 320, pads 324 mate with free ends 93 of the spring contacts 92 of base IC wafer 280. Test and response signals then pass between the test equipment and dice 82 through cable 328, connector 326, vias 322, pads 324 and spring contacts 92. Spring contacts 92 also convey power and ground signals to ICs 82.

FIG. 17 is a flow chart illustrating a exemplary method for forming and testing the multiple die assembly 89 of FIG. 4 in accordance with an embodiment of the invention. Starting with step 330, secondary IC wafers containing secondary IC dice 84–86 are fabricated in a conventional manner and subjected to conventional wafer level test procedures (step 332). The secondary IC wafers are then patterned with solder 90 (step 334) and cut to singulate their secondary IC die (step 336) with non-functional secondary IC dice being discarded. At step 338, a base IC wafer containing multiple base IC dice 82 is fabricated and spring contacts 92 are formed on the base IC wafer (step 340). The base ICs are then tested as illustrated in FIG. 14A or 14B(step 342).

At step 344, secondary IC dice 84–86 are placed on those base IC dice 82 of the base IC wafer passing the test at step 342. The resulting assembly is then heated to anneal spring contacts 92 and to reflow the balls of solder 90 so that they firmly bond the individual secondary IC die to each associated base IC die (step 346). After the resulting multiple die assemblies 89 are subjected to a final wafer level test as illustrated in FIG. 15 (step 348), the base IC wafer is then cut to separate the multiple die assemblies 89 (step 350). The substrate 98 or other substrate upon which the multiple die assembly 89 is to be mounted is fabricated at step 352 and clips 100 (FIG. 4) are added to the PCB at step 354. A multiple die assembly 89 is then clipped onto substrate 98 to form system 80 of FIG. 4 (step 356).

Thus has been shown and described a system for interconnecting a multiple die assembly to a PCB or other substrate in a manner that reduces signal path length and permits each part of the assembly to be separately tested at the wafer level in its intended interconnect environment.

While the forgoing specification has described what the applicant(s) consider to be the best mode(s) of practicing the invention, those of skill in the art will appreciate that the invention may be implemented in alterative ways. The appended claims are intended to cover all modes employing the combination of elements or steps recited in any one of the claims, including modes employing elements or steps that are functional equivalents of the elements or steps as described herein above.

What is claimed is:

1. A multiple die electronic system comprising:
   a substrate having conductors formed thereon,
   a base IC die having a first surface facing the substrate and a second surface parallel to the first surface,
   a first secondary IC die residing between the first surface of the base IC die and the substrate and linked to the first surface of the base IC die through first conductive signal paths,
   conductive contacts extending between the first surface of the base IC die and the conductors on the substrate for conveying first signals between the base IC die and the conductors on the substrate, wherein at least one of second signals provided between the first secondary IC die and the base IC die has a higher frequency than the first signals provided between the base IC die and the substrate.

2. The multiple die electronic system in accordance with claim 1 wherein solder forms the first conductive signal paths.

3. The multiple die electronic system in accordance with claim 1 wherein the substrate is a printed circuit board substrate.

4. The multiple die electronic system in accordance with claim 1 wherein the substrate is a semiconductor substrate.

5. The multiple die electronic system in accordance with claim 1 wherein the conductive contacts comprise resilient spring contacts.

6. The multiple die electronic system in accordance with claim 1 wherein the conductive contacts comprise:
   resilient spring contacts formed on the first surface of the base IC die, and a spring contact socket providing signal paths between the spring contacts and the conductors on the substrate.

7. The multiple die electronic system in accordance with claim 1 further comprising:
   a third level IC die residing between the first surface of the base IC die and a third surface of the first secondary IC die residing between the first surface of the base IC die and the substrate, the third level IC linked to the third surface of the second level IC die through conductive signal paths.

8. The multiple die electronic system in accordance with claim 5 wherein the spring contacts are formed an the first surface of the base IC die and soldered to the conductors on the substrate.

9. A multiple die electronic comprising:
   a substrate having conductors formed thereon:
   a base IC die having a first surface facing the substrate and a second surface parallel to the first surface;
   a first secondary IC die residing between the first surface of the base IC die and the substrate and linked to the first surface of the base IC die through first conductive signal paths;
   conductive contacts comprising resilient springs extending between the first surface of the base IC die and the conductors on the substrate for conveying signals between the base IC die and the conductors on the substrate; and
   means for holding the base IC die proximate to the substrate so that the spring contacts are compressed against the conductors on the surface of the substrate.

10. A multiple die electronic comprising:
    a substrate having conductors formed thereon;
    a base IC die having a first surface facing the substrate and a second surface parallel to the first surface;
    a first secondary IC die residing between the first surface of the base IC die and the substrate and linked to the first surface of the base IC die through first conductive signal paths;
    first conductive contacts extending between the first surface of the base IC die and the conductors on the substrate for conveying signals between the base IC die and the conductors on the substrate;
    a second secondary IC die; and
    second conductive paths linking the second secondary IC die to the second surface of the base IC die.

11. The multiple die electronic system in accordance with claim 10 further comprising:
    conductive vias for providing signal paths between the first and second surfaces of the base IC die.

12. The multiple die electronic system in accordance with claim 10 wherein the second conductive paths comprise spring contacts.

* * * * *